(12) United States Patent
Ong et al.

(10) Patent No.: US 8,132,874 B2
(45) Date of Patent: Mar. 13, 2012

(54) SERVER CHASSIS RACK RAIL WITH SELF-ALIGNING, MAGNETIC GUIDE ASSEMBLY FOR POSITIONING SERVERS IN STORAGE RACK

(75) Inventors: Brett C. Ong, San Jose, CA (US); Timothy W. Olesiewicz, Santa Clara, CA (US); Frank M. Miyahira, San Mateo, CA (US)

(73) Assignee: Oracle America, Inc., Redwood City, CA (US)

( * ) Notice: Subject to any disclaimer, the term of this patent is extended or adjusted under 35 U.S.C. 154(b) by 421 days.

(21) Appl. No.: 12/437,662

(22) Filed: May 8, 2009

(65) Prior Publication Data

US 2010/0282932 A1    Nov. 11, 2010

(51) Int. Cl.
*A47B 88/00* (2006.01)
(52) U.S. Cl. ............... 312/334.4; 312/334.1; 211/26
(58) Field of Classification Search ............ 312/334.4, 312/334.5, 334.7, 334.8, 265.1–265.4, 334.1; 384/22; 211/26, 13.1; 248/274.1, 287.1, 248/298.1
See application file for complete search history.

(56) References Cited

U.S. PATENT DOCUMENTS

| | | | |
|---|---|---|---|
| 6,303,864 B1 * | 10/2001 | Johnson et al. | 174/69 |
| 6,305,556 B1 * | 10/2001 | Mayer | 211/26 |
| 6,377,447 B1 * | 4/2002 | Boe | 361/679.33 |
| 6,856,505 B1 * | 2/2005 | Venegas et al. | 361/679.05 |
| 2002/0158556 A1 * | 10/2002 | Cheng | 312/333 |
| 2005/0285492 A1 * | 12/2005 | Hu et al. | 312/334.4 |
| 2006/0113433 A1 * | 6/2006 | Chen et al. | 248/70 |

* cited by examiner

*Primary Examiner* — Darnell Jayne
*Assistant Examiner* — Andres F Gallego
(74) *Attorney, Agent, or Firm* — Marsh Fischmann & Breyfogle LLP; Kent A. Lembke

(57) ABSTRACT

A storage rack for supporting a server chassis in a storage cabinet. The storage rack includes vertical supports and outer rails attached to the vertical supports. The storage rack includes first and second middle rails supported by the first and second outer rails such that the middle rails may slide upon the outer rails. First and second inner rails slidably engage with the first and second outer rails and are typically attached the sides of the chassis. The storage rack further includes first and second magnetic guide assemblies that are each attached to an exposed end of one of the first and second inner rails. Each of the magnetic guide assemblies includes first and second magnetic alignment elements extending outward an alignment distance from the exposed end of the corresponding one of the inner rails such that magnetic forces assist both in initial alignment and in engagement.

13 Claims, 8 Drawing Sheets

SERVER CHASSIS RACK RAIL WITH SELF-ALIGNING, MAGNETIC GUIDE ASSEMBLY FOR POSITIONING SERVERS IN STORAGE RACK

BACKGROUND

1. Field of the Invention

The present invention relates to computer devices such as servers and storage or positioning of such computer devices in storage racks and, in particular, to a mounting or guide assembly for use with a rack rail or inner rail of a computer or server chassis to facilitate positioning or alignment of the rack rail or inner rail with a receiving portion, e.g., a middle or outer member or rail, of a storage rack. In some cases, a rail kit is provided that provides magnetic, self-aligning between an inner rail and a middle rail, which may be extended outward from an outer rail of the rack kit during installation of a server or other computing device in a storage rack.

2. Relevant Background

Servers and other computer devices are often stored in cabinets or racks. Each of these cabinets or racks may contain numerous servers in a stacked or side-by-side arrangement. For example, a server cabinet may house 5 to 10 servers behind each door. It is desirable for each server to be installed and/or serviced without affecting operation of the other servers, and, in many cases, it is desirable for each server to be maintained or accessed without disconnecting it from power or communications/network links (e.g., to provide hot swappable and maintainable servers in an enterprise or data center environment).

To this end, each server is typically mounted within the cabinet or storage rack using a rail or slide kit. In a typical rail kit, a pair of outer members or rails is attached to the storage rack frame and to extend horizontally to define a server mounting location within the storage rack or cabinet. Each outer rail is mated with or interconnected with a middle rail or middle member of the rail kit. The middle rail often will be supported within the inner channel or grooves of the outer rail, and the middle rail may be positioned by sliding within the outer rail from a retracted position to an extended position. In the extended position, the middle rail typically extends outward from the end of the outer rail several inches to a foot or more to allow access to an attached or supported server. In the retracted position, the middle rail has its outer end positioned within the outer rail.

To mount a server in the rack, a pair of inner or rack rails is attached to an outer surface of a server (or other computer device) chassis, and each of the inner or rack rails is coupled with or interconnected with a corresponding one of the middle members or rails. Generally, a server is mounted within the server storage rack by extending out the middle rail, then aligning the ends of both of the inner or rack rails on the server chassis with the ends of the middle rails, and, once proper alignment is achieved on both sides, pushing on the server chassis to cause the inner rails or racks to mate or couple with the middle members or rails (e.g., in a tongue-and-groove manner) as the inner rails slide within channels or grooves of the middle member or rails. Continued pushing then causes the middle member or rail to slide within the outer rail or member from the extended position to the retracted position, which allows the storage rack door to be closed. Within the storage rack a cable management arm (CMA) or similar device is typically pivotally or slidably mounted on the outer rail or member.

During installation, a CMA retainer or clasp on the end of the inner rail may be coupled with a connector or clasp on the CMA, e.g., when the server is first pushed inward into the cabinet or rack. Power and communication cables are then fed through supports or cable guides on the CMA and attached to the back of the server. When maintenance or access to the server is desired, the server may be pulled out of the rack with the middle rail or member sliding within or on the outer rail or member of the rail kit. The inner or rack rail affixed to the server chassis slides within or on the middle rail or member, which causes the attached cable supported by the CMA to follow the server within the storage rack without requiring disconnection.

A number of issues can work alone or together to make installation of a server in existing storage racks difficult and even unsafe. Servers are often relatively heavy sometimes weighing up to 65 pounds or more. As a result, it is often a challenge for a technician to support the weight of the server while also trying to align the ends of the inner rails with the receiving channels or grooves of the middle rails. In practice, proper alignment is only achieved if the technician is able to hold the server relatively level without side-to-side rotation. This is further problematic as the middle rails may not both be extended the same amount and may move during alignment (e.g., toward the rack or side-to-side).

Alignment has become increasingly difficult as rail designs have become thinner such that the receiving channel of the middle rail is not as deep and, likewise the mating walls or portions of the inner rail are not as large. Compact rails are desirable to reduce the size of the rack and increase the number of servers that can be positioned within a particular space or volume, but thinner rail cross-sectional areas make alignment and engagement between the inner rail and middle rail more difficult. Alignment and engagement of these two rails may be critical for proper installation, and failure to obtain this alignment and then engagement may result in damage to the server and a safety hazard to the installing technician. For example, a technician that is installing a server in a storage rack may believe they have aligned the ends of the inner rail and the middle rail and obtained adequate engagement between the rails. However, this may be hard or impossible to verify such as when the CMA retainer at the end of the inner rail blocks the technician's view of the middle rail. If alignment and engagement is not achieved and the technician stops supporting the server, the server likely will fall out of the storage rack causing damage to the server and potentially injuring the technician with its weight of 65 pounds or more and often sharp metal edges.

Hence, there is a demand for improved devices and methods for installing or mounting servers or other computer devices in storage racks. Preferably, such mounting devices would facilitate proper alignment of the inner rails on the server chassis with the middle rails of the storage rack and such alignment would be relatively simple to detect or verify and would be concurrent for both sides of the chassis. In some cases, it is also preferable for the mounting device to support positioning of a CMA retainer or other device for coupling the server chassis with a CMA associated with the installed server.

SUMMARY

Briefly, magnetic guide assemblies and storage racks including such guide assemblies are provided that facilitate initial installation of a server, computing device, or other electronic or other object that is positioned in a storage rack or cabinet. Initial installation can be difficult as a heavy server chassis (or object housing) is manually supported and a pair of rack rails attached to the sides or sidewalls of the chassis are aligned with receiving ends of storage rack rails, e.g., ends of inner rails attached to a server chassis are aligned and engaged with an extended pair of middle rails, which in turn are supported upon outer rails of a server rail kit. To facilitate alignment, magnetic guide assemblies are provided on the end of each inner rail.

Each guide assembly includes a pair of magnetic alignment elements, and each of these may include two or more permanent magnets defining an elongated magnetic field with an alignment axis. The alignment elements are spaced apart similarly to the ferrous or metallic rail elements of the middle rails such that when the guide assemblies are positioned proximate to the ends of the middle rails the magnetic forces cause the guide assemblies to be attracted to the middle rails, which automatically creates proper alignment between the inner and middle rail ends. The body of each guide assembly may optionally include a cable management arm (CMA) retainer for mating or coupling with a CMA that may be included in the storage rack. Also, to facilitate proper engagement, each of the magnet alignment elements typically will be positioned and have adequate length such that a portion of the aligning magnetic field is applied during initial alignment (e.g., by having the guide assembly extend a distance out from the end of the inner rail) and after alignment during initial engagement (e.g., by having the alignment element overlap or be positioned adjacent an end of the inner rail or its rail elements).

More particularly, a storage rack is provided for supporting a chassis of a computing device such that the computing device is slidably positioned between a first, retracted position and a second, extended position. The storage rack includes a number of vertical supports or columns and first and second spaced apart outer rails attached to the vertical supports to extend in a horizontal plane, e.g., to define a shelf or horizontal server position or the like. The storage rack also includes first and second middle rails supported by the first and second outer rails such that the middle rails may slide upon the outer rails, and typically such that the middle rails may be placed in a retracted position and an extended or service position extending outward from the ends of the outer rails. First and second inner rails are included that are configured for slidably engaging with the first and second outer rails. In use, the first and second inner rails are typically attached to the sides of the chassis of the computing device.

The storage rack further includes first and second magnetic guide assemblies that are each attached to an exposed end of one of the first and second inner rails. Each of the magnetic guide assemblies includes first and second magnetic alignment elements extending outward an alignment distance from the exposed end of the corresponding one of the inner rails. Each of the first and second middle rails may have a body and an upper and a lower rail element extending outward from the body. In some cases, the upper and lower rail elements include a ferrous material or metal rail such that the first and second magnetic alignment elements apply attractive magnetic forces pulling the magnetic guide assemblies toward the middle rails (e.g., with permanent magnets arranged with their magnetic poles oriented to apply an attractive force on the ferrous material of the rail elements). The first magnetic alignment element may define a first alignment axis and the second magnetic alignment element may define a second alignment axis, typically parallel to the first alignment axis, and the first and second alignment axes may be separated by a magnet separation distance corresponding with a spacing of the upper and lower rail elements of the middle rails (e.g., the longitudinal axes of the rail elements of the middle rail may be separated by a distance about equal to the magnet separation distance or separation of the two alignment axes).

In some embodiments of the storage rack, each of the magnetic guide assemblies may be attached to one of the first and second inner rails such that a portion of each of the first and second magnetic alignment elements extends an engagement distance adjacent to the exposed end. In this manner, magnetic forces may be applied by the portions for the first and second magnetic alignment elements during initial engagement between the exposed ends of the inner rails and the middle rails. For example, the alignment elements may each include a single bar magnet with a portion of its body extending past or overlapping with a portion of the end of the inner rail (or its rail elements) to facilitate alignment during initial engagement. In other cases, two or more permanent magnets may be used to provide each alignment element, and, in such cases, one or more of the magnets may be positioned adjacent a portion of the end of the inner rail (or an end of one of its rail elements). In one exemplary storage rack, the alignment distance is at least about 0.5 inches and the engagement distance is at least about 0.25 inches to assist in alignment and then initial engagement.

The storage rack may be provided such that each of the first and second magnetic assemblies includes a body supporting first and second magnetic alignment elements. In such cases, the body may include a central portion with a cable management arm (CMA) retainer for mating with a connector of a cable management arm. In some cases, the body may include two or more tabs extending laterally outward from the cable management arm retainer upon which the first and second magnetic alignment elements are attached. In some embodiments of a storage rack, each of the first and second magnetic alignment elements includes at least one permanent magnet and the first and second middle rails each include a pair of ferrous rail elements proximate to an end of the corresponding middle rail.

DETAILED DESCRIPTION

Figure 1:
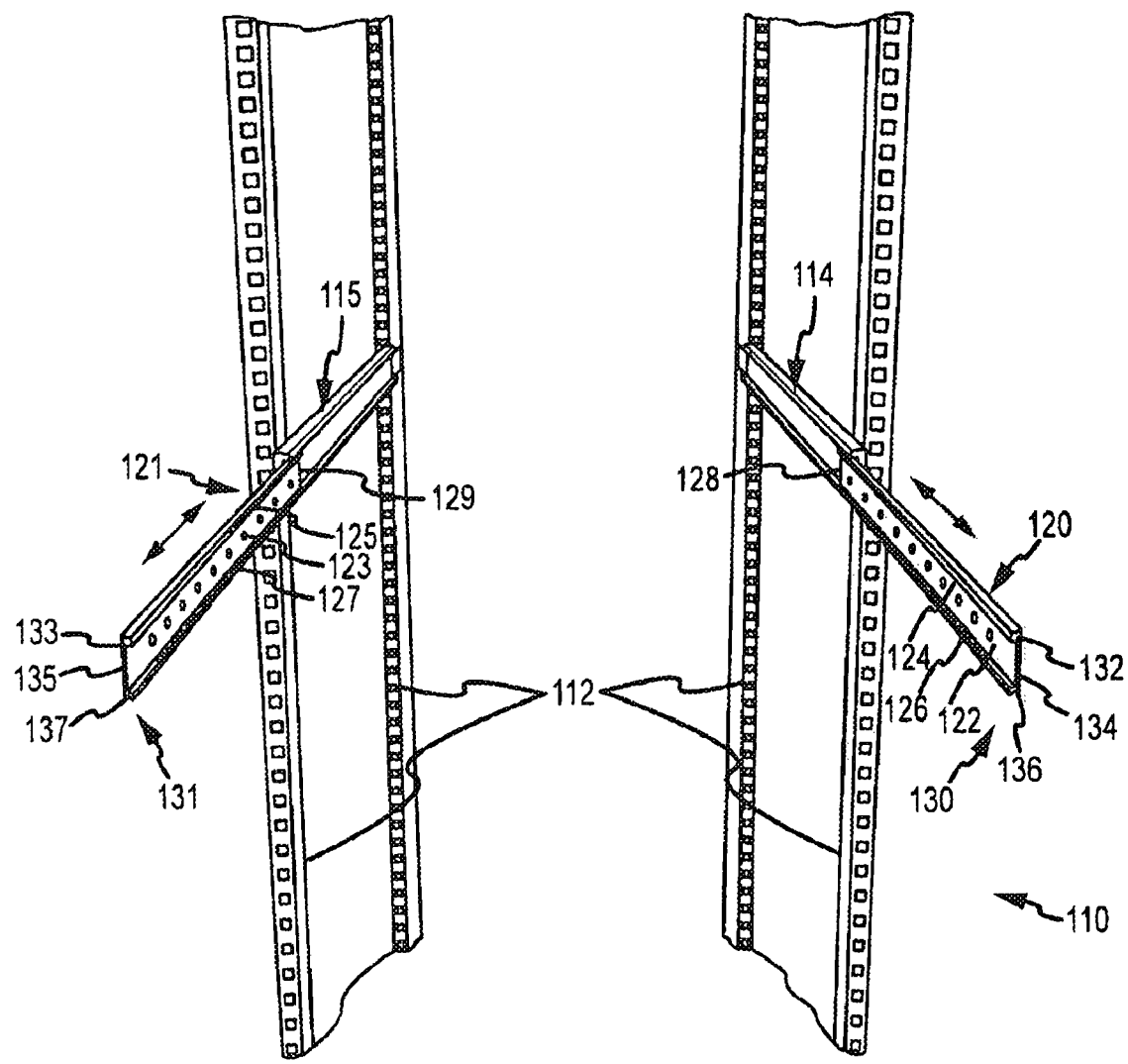
FIG. 1 is a perspective view of a computer or server storage rack prior to insertion or mounting of a computer or server showing a middle rail or member in an extended position from an outer rail or outer rack member.

Briefly, a magnetic guide assembly, which may also be termed a magnetic, self-aligning rack rail engagement mechanism, is described for use with rail or slide kits or within a storage rack to facilitate installation of computing devices such as servers within the storage rack or cabinet. Storage racks typically include a rail kit for mounting a server within the storage rack. The rail kit may include a pair of outer rails or outer rack members that are attached to vertical supports or columns and are typically arranged horizontally to define a server storage position in the storage rack. The rail kit further includes a pair of middle rails or middle rack members that are supported within or by the outer rails such that they can be slid between a retracted position and an extended position in which the middle rails extend outward some distance from the end of the outer rail. This extended position facilitates initial engagement or mounting of a server onto the storage rack.

Specifically, the rail kit may further include a pair of inner rail or inner rack members that are attached to either side of a server chassis (or computing device housing), and the server is mounted in the storage rack by concurrently aligning the ends of these inner rails with ends of the extended middle rails and then slidably engaging each of these pairs of rails (e.g., by sliding the inner rails within receiving channels or grooves of the middle rail toward the outer rails and/or storage rack vertical supports). Alignment of the inner rail to the outer rail may be difficult due to the weight of the server and due to the thin or small cross sectional area of the receiving inner rail (or its receiving grooves/channels and/or profile). Service personnel may be forced to not only support the weight of the server but also to line up or align the inner and outer rails on both sides of the server chassis at the same time. Alignment may be more difficult as cable management arm (CMA) retainers provided at the ends of the inner rails may block or hinder the view of the service personnel of the middle rails and their receiving grooves/channels and/or rail elements (or sidewalls).

To facilitate alignment and initial engagement of the inner rails with the middle rails, the storage racks (or rail kits for use with such racks) described herein provide a magnetic guide assembly (or magnetic, self-aligning rack rail engagement mechanism) that is attached or affixed to the engaging or exposed end of each of the inner rails. Each magnetic guide assembly includes a tab or body extending outward from the engaging end of an inner rail with two or more magnetic alignment elements (e.g., permanent magnets) exposed on one surface or side. The magnetic alignment elements are positioned to suit a particular inner rail such that they define a pair of spaced apart alignment axes on the tab or body that matches a configuration of a pair of metallic/ferrous sidewalls or rail members of the middle rail. In other words, each middle rail typically includes a body and a pair of outer sidewalls or rail members extending along and outward from the body to define a profile with receiving channels or grooves for mating with the inner rail (and its profile with a body and rail members/sidewalls). The alignment axes of the magnetic alignment elements are spaced apart similarly to the outer sidewalls or rail members, such that the magnetic fields generated by the magnetic alignment elements attract the magnetic guide assembly or tab to the outer sidewalls (or inward extending portions of such sidewalls) to align the guide assembly with the middle rail as well as aligning the end of the inner rail with the profile or receiving channels/grooves on the end of the inner rails to facilitate engagement with the now aligned inner and middle rails.

The magnetized alignment tab or body may also double as or act as a CMA attachment device or retainer (e.g., may replace a conventional CMA retainer). To this end, the body of the guide assembly may be thought of as having a central CMA attachment or retainer portion and a pair of extensions or flanges extending outward to each side of this central body or tab, whereby the guide assembly has a width similar Lo or matching the middle rail (or a spacing of its sidewalls or rail elements). The extensions or flanges (or outer side portions of the body/tab) may retain the magnetic alignment elements, with one embodiment including four permanent magnets (e.g., a pair of neodymium button magnets on each side of the body/tab defining a pair of spaced apart alignment axes on the guide assembly).

Figure 7:
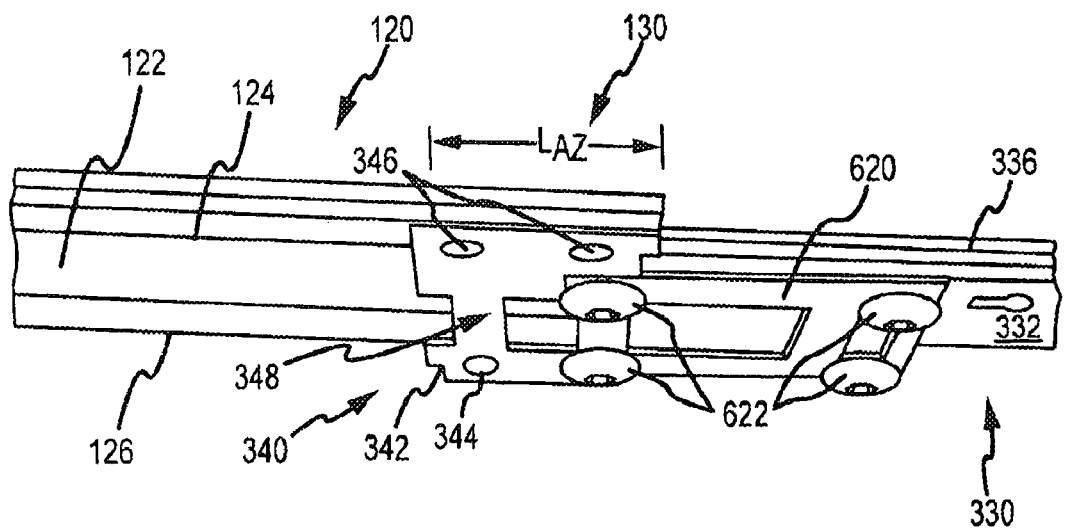

The arrangement or configuration of the magnetic guide assembly serves several purposes. The guide assembly makes initial alignment and engagement of the inner rail to the middle rail automatic (or nearly so) as the magnets are attracted to and act to attach the guide body to the outer sidewalls or rail elements of the middle sidewall. In this aligned position (as shown in FIG. 7, for example), the end of the inner rail is properly aligned with the end of the middle rail such that the outer sidewalls or rail elements of the inner rail may be received by or engaged by the receiving grooves/channels in the middle rail. As the inner rail engages, the magnets keep the inner rail adhered to the middle rail as the server connected to the inner rails is slid into the storage rack, e.g., the inner rails affixed to the sides of the server chassis are slid into the engaged middle rails (which, in turn, may slide within/on the outer rails). Once the server is installed in the storage rack, the magnetized tab or body of each guide assembly may enable alignment of the CMA latch or retainer portion of the guide assembly within the storage rack to the CMA (and its coupling/connection member(s)). This allows the user or service personnel/technician to effectively engage the slide rails/CMA and ensure proper alignment with minimal effort without tools and with increased safety.

As will become clear from the following description, use of storage racks with magnetic alignment guides enables low cost and effective server alignment during server installation. This is achieved in part by automatic alignment of interface members (e.g., ends of the inner and middle rails) supported by the magnetic fields/forces provided by the magnetic alignment elements attracting the guide assembly to the end of the middle rail. Magnetized engagement also helps compensate for loose tolerances in rack rail dimensions. Since the inner rail self-aligns to the middle rail, ease of server installation may be greatly improved. The guide assemblies provide a number of advantages and benefits. For example, the magnetic-based alignment and engagement of the inner and middle rails may also facilitate engagement or coupling between CMA retainer components with the CMA or with a latch on the CMA after the server is installed or during final stages of server installation in a storage rack. Additionally, use of the magnetic guide assemblies on the inner rails improves rack rail and CMA alignment and engagement. User intervention by the service personnel or technician may be reduced or even nearly eliminated as alignment and initial engagement is "automated" in the sense that the magnetic alignment elements engage with or attach to portions of the middle rail near the end of the middle rail. The guide assemblies are inexpensive to manufacture and install on the inner rails and no modification of the middle rail is demanded. The use of the magnetic guide assemblies also facilitates proper initial engagement of the inner rails with the middle rails, which significantly improves safety for the service personnel as it nearly eliminates risks associated with dislodged or dropped servers during installation.

Turning now to the figures, FIG. 1 illustrates a perspective view of one embodiment of a computer or server storage rack or cabinet 110 adapted for storing one or more servers or other computing devices. The cabinet 110 may be adapted such that sets of its rails (e.g., middle rails) may be slid out to facilitate installation of components on the rails, and the cabinet 110 may be adapted such that the servers or other components/objects mounted therein may be slid outward on supporting rails for ease of maintenance and other access to the servers or other components/objects and then slid back into the rack 110. The storage rack 110 includes a number of vertical columns or supports 112 that extend upward from a floor or other platform. The vertical supports 112 may be formed of metal, plastic, or the like and may be positioned in or near the corners of the storage rack 110. To support each server or computing device (not shown in FIG. 1), the storage rack 110 includes first and second (or right and left) outer rails or rack members 114, 115, which are attached to the vertical supports 112 and extend horizontally (parallel to each other) within the rack 110 to define a vertical rack position or shelf in the cabinet or rack 110. The outer rails 114, 115 may take many forms to practice the rack 110 and are typically formed of a stiff or rigid material such as a metal or plastic and include an inner channel for receiving and/or slidably engaging with or supporting a middle rail or rack member.

In the example of FIG. 1, the rack 110 includes a pair of middle rails or rack members 120, 121 that are supported by the outer rails 114, 115, respectively. The middle rails 120, 121 include elongated members or bodies 122, 123 with a pair of spaced apart outer sidewalls or rail elements 124, 126 and 125, 127, and the middle rails 120, 121 may be slid (e.g., slidably engages with outer rails 114, 115) from a retracted position within (or mostly within) the outer rails to the extended position shown in FIG. 1 that is useful for installation of a server/computing device and for later access for maintenance and the like. The middle rails 120, 121 have inner or first ends 128, 129 that remain engaged/supported by the outer rails 114, 115, and the rails 120, 121 include outer or second ends 130, 131 that can be extended out from the outer rails 114, 115 and are adapted for receiving and initially engaging with inner rails, which are attached to a server or computer chassis/housing.

The ends 130, 131 each have a profile or receiving surface that is defined by the sidewalls or rail elements 124, 126 and 125, 127 and by the body 122, 123. The receiving surface or end profile of the end 130 includes a first/upper channel or groove 132, a tongue or body portion 134, and a second/lower channel or groove 136, and the receiving surface or end profile of the end 131 includes a first/upper channel 133, a tongue or body portion 135, and a second/lower channel 137. Generally, the profiles or receiving surfaces of the ends 130, 131 are configured to receive the ends of the inner rails, e.g., may have a mirror configuration with proper dimensions/shapes (e.g., a groove or channel in the receiving middle rail may correspond with a raised surface or rail element of the inner rail and so on). The end 130 is shown in more detail in FIG. 2, and the end 130 can be seen to have a profile defined in part by the sidewalls or rail elements 124, 126. The rail elements 124, 126 have a depth, $d_{wall}$, a thickness, $t_{wall}$, and a spacing that define the profile. The profile or receiving surface of the end 130 is further defined by a depth, $d_{groove}$, of the channels or grooves 132, 136 as may be measured from the tops of the sidewalls 124, 126 to the tongue/body portion 134 or may extend past the surface of the tongue/body portion 134.

Figure 2:
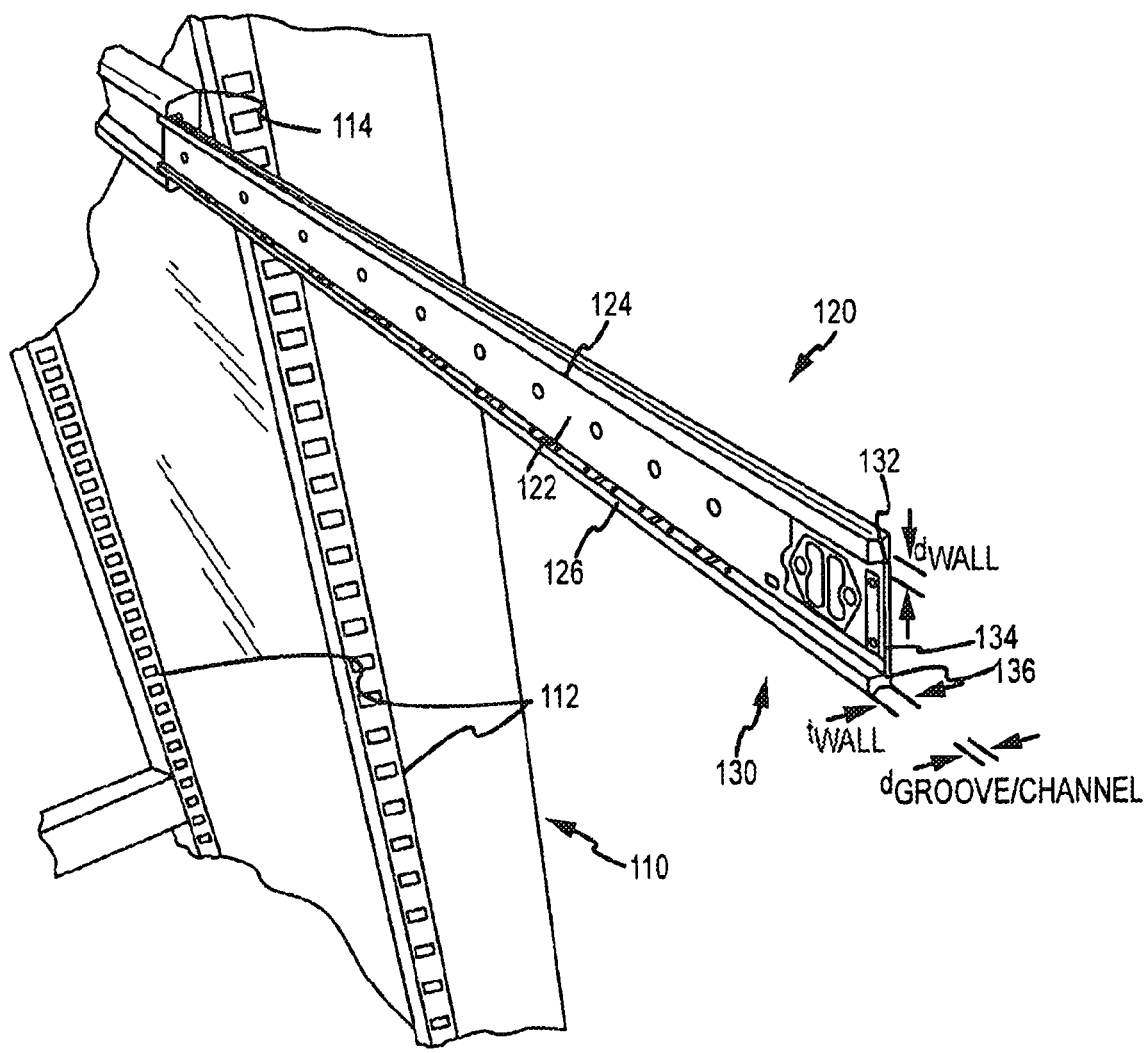
FIG. 2 is an enlarged or close up view of one of the extended middle rail or middle rack members of FIG. 1 illustrating an engagement profile or channels/grooves for receiving an inner rail or rack member of a computer/server chassis.
Figure 3:
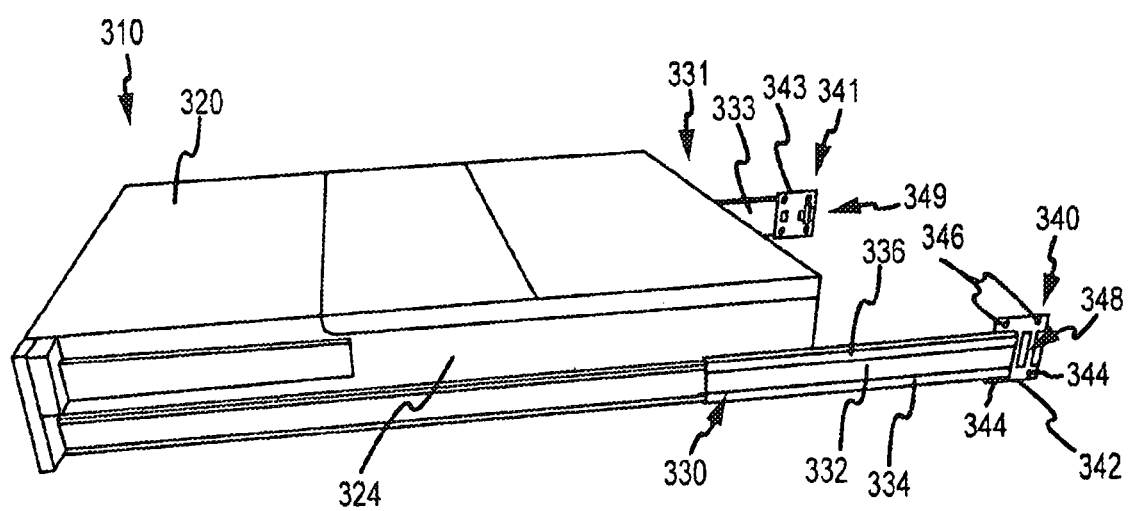
FIG. 3 is a perspective side view of a computing device such as a server with a pair of inner rails or rack members attached to sides of its chassis for use in supporting the device within the storage rack or cabinet of FIG. 1, e.g., for mating or engaging the middle rails or rack members.

FIG. 3 illustrates a computing device 310 such as a server adapted for mounting within the storage rack 110 of FIGS. 1 and 2. As shown, the server 310 includes a housing or chassis 320 with sides/sidewalls 324, and an inner rail or rack member 330, 331 is attached to each chassis sidewall 324. The inner rails 330, 331 each include an elongated or linear body 332, 333 that is attached at a first end to one of the sidewalls 324 such that it extends outward past the sidewall 324 to its other or second end. A pair of sidewalls or rail elements 334, 336 (not shown for rail 331 as facing into page) extend the length of the body 332, 333, and the bodies 332, 333 combined with the rail elements 334, 336 define the profile of the inner rails 330, 331 for mating with the profile/receiving surface of the end 130 of the middle rails 120, 121 (e.g., see FIG. 2).

On the protruding or second end of each inner rail 330, 331, the server 310 includes a magnetic guide assembly 340, 341. As discussed above, the magnetic guide assemblies 340, 341 may serve the dual purposes of assisting automatic or blind alignment with the ends 130 of middle rails 120, 121 while also providing a CMA retainer for mating with a CMA in the rack 110 that receives the server 310. Each of guide assemblies 340, 341 generally includes a body 342, 343 (e.g., a planar body with a width greater than the body 332, 333 of rail 330, 331). To provide automated, blind alignment, a set or number of magnetic alignment elements 344, 346 is provided on each guide assembly 340, 341. In the embodiment shown in FIG. 3, the body 342, 343 includes four permanent magnets (e.g., button, rectangular, or other-shaped magnets) arranged in pairs of 2 magnets 344 and 346 on opposite sides of the body 342, 343. As will become clear, the magnetic alignment elements 344 and 346 are spaced apart from each other a distance selected based upon a spacing of sidewalls/rail elements on the middle rail such that the magnetic elements 344, 346 are attracted to and attach to the aligned sidewalls/rail elements of a corresponding middle rail. The width of the body 342, 343 is also chosen based on the width of the middle rail, which typically calls for tabs or extensions on the bodies 342, 343 that protrude from or extend outward from (or with a greater width than) the body 332, 333 of the inner rails 330, 331 (as shown in FIG. 3).

To facilitate mating with a CMA, the body 342, 343 may also include a CMA retainer portion 348, 349, which may include one or more bars or loops and openings to suit the particular CMA clasp or mating end (and which may vary based upon a particular CMA used in a storage rack 110). The particular arrangement of the CMA retainer portion 348, 349 is not as relevant here as is the fact that the magnetic guide assembly 340, 341 servers to replace a conventional CMA retainer to provide guided alignment using magnetic forces while also providing functions of a CMA retainer.

Figure 4:
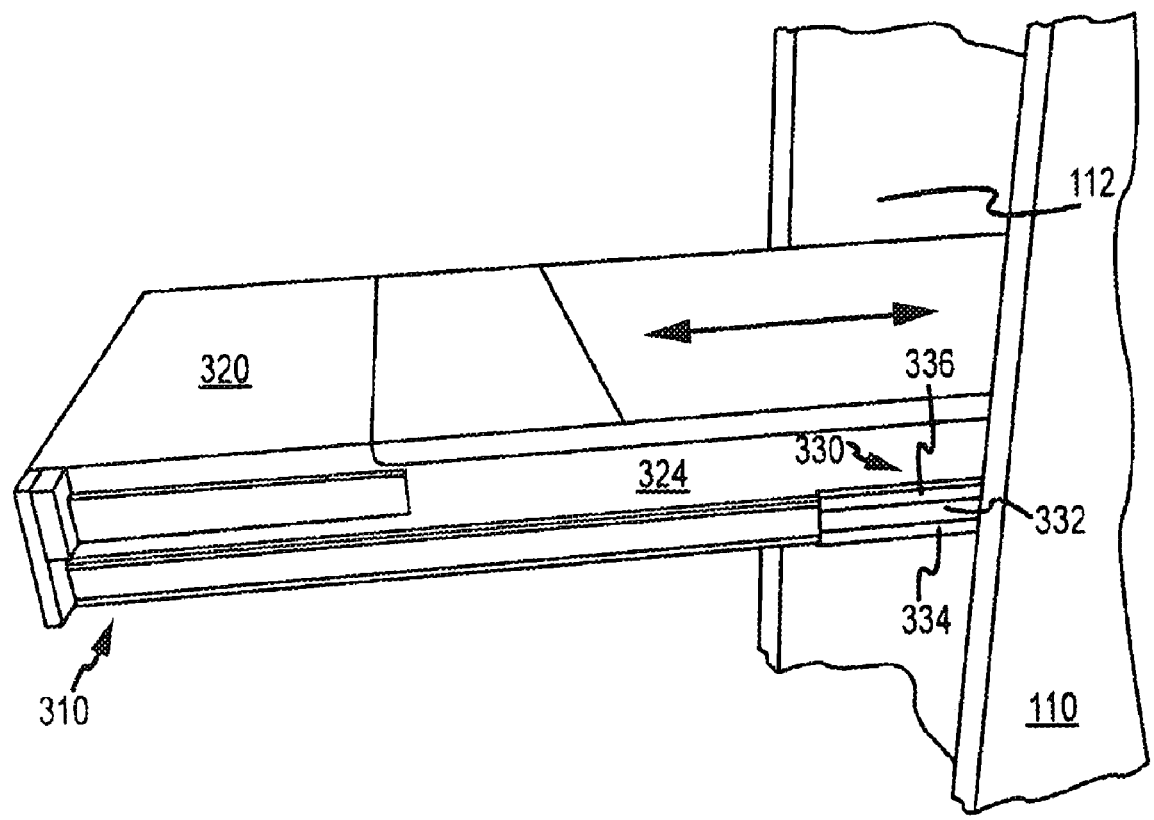
FIG. 4 is a perspective view of the storage rack or cabinet of FIG. 1 upon alignment and engagement of the inner rails with the middle rails of the storage rack, with the server or computer chassis shown in the extended or maintenance access position.

FIG. 4 illustrates the server 310 after it has been installed in the storage rack 110. An arrow is used to show that the server 310 may be slid inward and outward on the supporting middle rail (not shown in FIG. 4 as hidden within rack 110). To achieve such mounting, the inner rail 330 (and rail 331) is aligned and engaged with the middle rail, such as rail 120 (and rail 121), and this is achieved in embodiments described herein using magnetic guide assemblies that assist a technician or service worker in aligning the body 332 and sidewalls or rail elements 334, 336 (or mating profile/end) of the inner rail 330 with the receiving surface or profile of the middle rail (e.g., with tongue/body 134 and channels/grooves 132, 136). As discussed above, a difficult aspect of the mounting of the server 310 in rack 110 is the initial alignment and engagement, and it is during this portion of mounting that the magnetic guide assemblies described are advantageous compared with a conventional CMA retainer.

Figure 5:
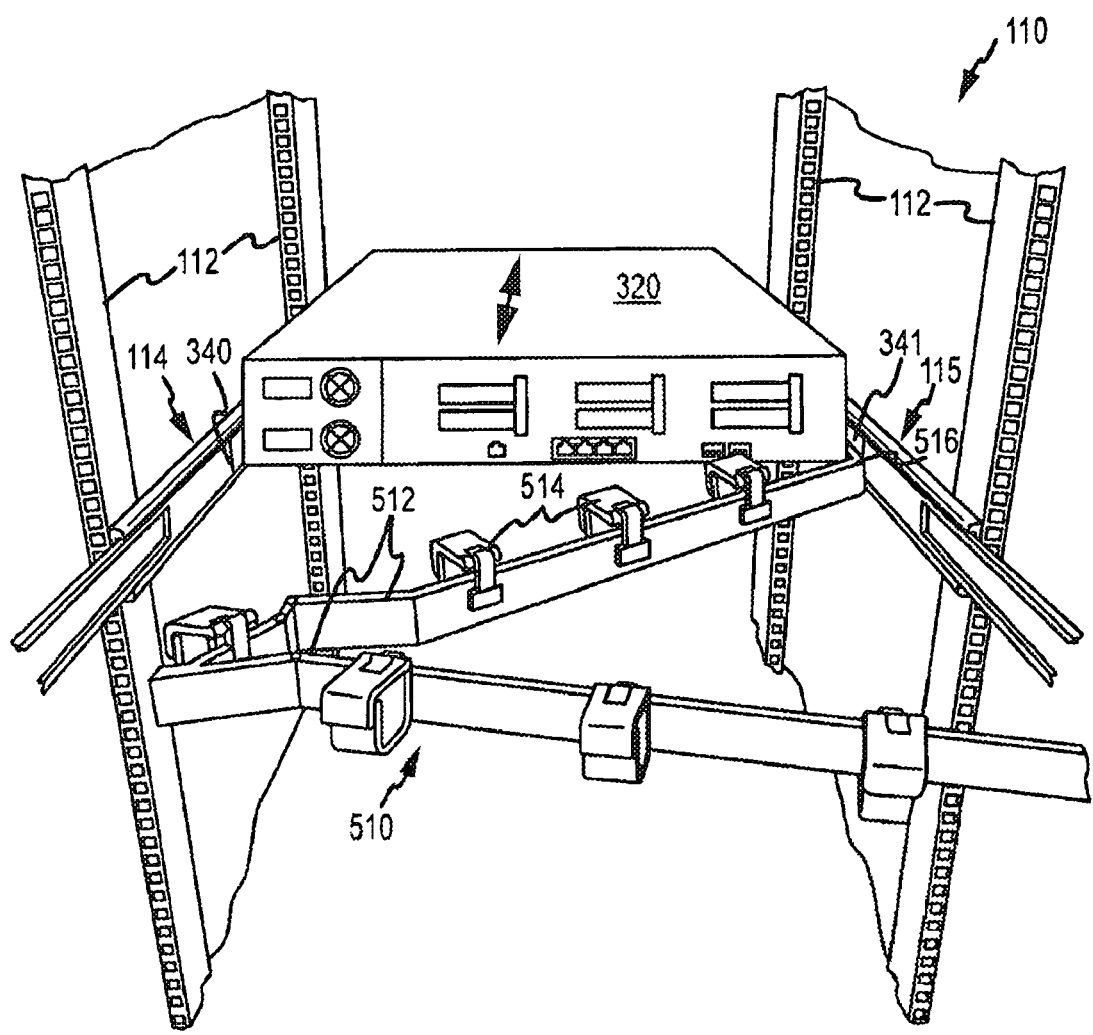
FIG. 5 is a perspective rear view of the storage rack or cabinet of FIG. 4 showing coupling of a CMA retainer on an end of one of the inner rails with a CMA (but prior to installation of or without showing cables connected to the rear of the supported computing device)

FIG. 5 shows a storage rack 110 with the server chassis 320 mounted on and supported on the vertical supports 112 and outer rails 114, 115 (and middle rails). The chassis 320 is shown in a retracted or "in cabinet" position in which the inner rails are slid fully into the middle rails, which are in turn slid into the rack 110 on or in outer rails 114, 115. In this retracted position, the magnetic guide assemblies 340, 341 are positioned within the storage rack 110. In this position, one or more of the guide assemblies 340, 341 may be connected or mated with a CMA. The storage rack 110 includes a CMA 510 with an arm(s) 512 upon which a number of guides or loops 514 are provided for receiving cables that would be connected to the back wall of server chassis 320. A clasp or connector 516 of the CMA 510 is shown to be connected to or mated with the magnetic guide assembly 341 (e.g., to the CMA retainer portion 349 shown in FIG. 3). During use after such connection, the CMA 510 will accordion arm 512 in and out with the chassis 320 in the storage rack 110 so as to allow the supported cables to remain connected to the chassis 320 (or server 310) to allow access/maintenance of the server without disconnecting power/communications.

Figure 6:
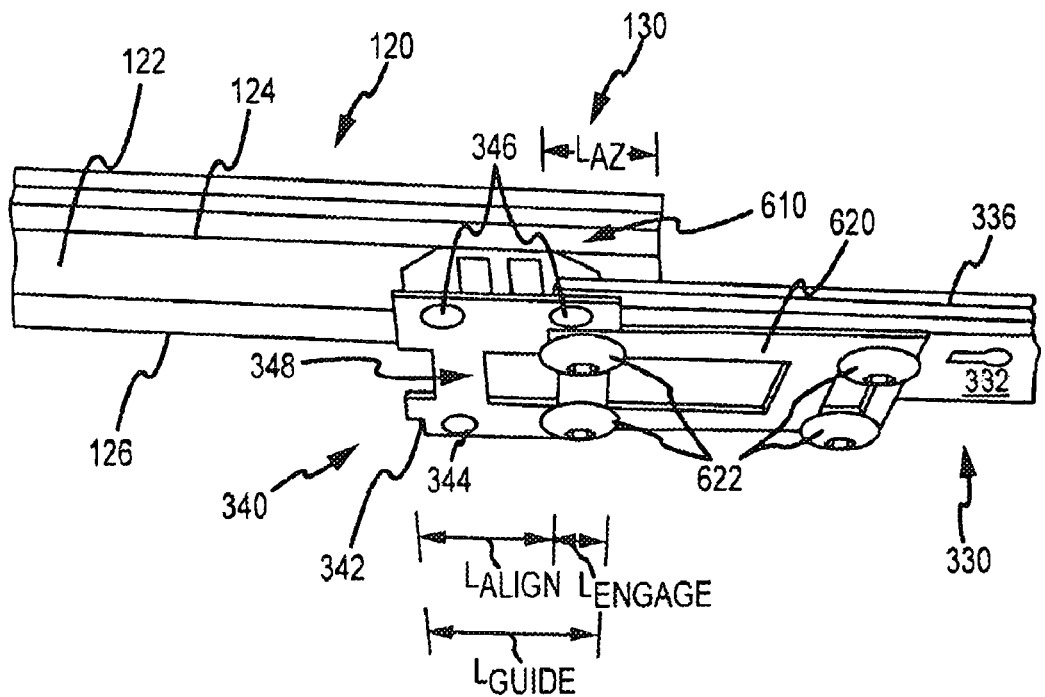
FIGS. 6 and 7 illustrate the ends of a middle rail and inner rail before engagement and after alignment and initial engagement of the rails using a magnetic guide assembly of an embodiment described herein.
Figure 8:
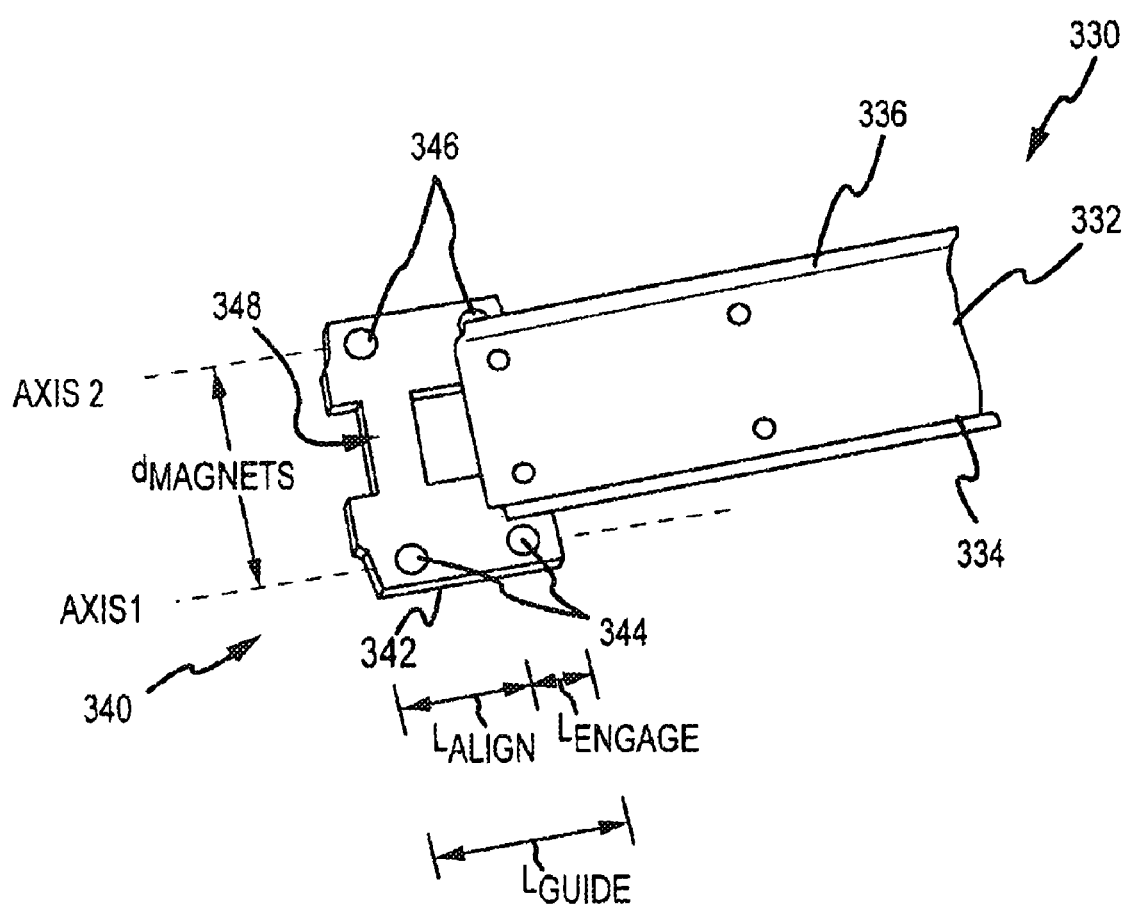
FIG. 8 illustrates the end of the exemplary inner rail of FIGS. 6 and 7 showing the mating or alignment contact surface/side of the magnetic guide assembly.

FIGS. 6-8 illustrate in more detail an inner rail 330 with a magnetic guide assembly 340 of an embodiment that is useful for aligning and engaging the rail 330 with a middle rail 120 of a storage rack. In FIG. 6, a portion or length of the sidewalls or rail elements 124, 126 of the middle rail 120 may be considered an alignment/contact zone 610, and it is this zone or portion 610 that is used to both align and engage the outer or second end of the inner rail 330 with the middle rail 120. This alignment/contact zone 610 may have a length, $L_{AZ}$, such as 0.5 to 2 inches or more. With this in mind, the magnetic guide assembly 340 includes a body 342 (e.g., a planar body with tabs or side extensions) with a length, $L_{Guide}$, that is chosen to be long enough such that it can define an adequate alignment length, $L_{Align}$, as well as an engagement length or zone, $L_{Engage}$. In other words, a first portion of the guide assembly body 342 is used to provide alignment between the inner rail 330 and the middle rail 120 and then a second portion of the guide assembly body 342 is used to provide initial engagement between the rails 120, 330 (as well as continued alignment during such engagement).

As shown, for example, a mounting bracket 620 is used to attach the guide assembly 340 to the end of the inner rail 330 with fasteners 622. The guide assembly 340 is attached such that a portion of the body 342 extends outward from the end of the inner rail 330 or its body 332 and rail elements 334, 336 to define the alignment length, $L_{Align}$. Two pairs of magnetic alignment elements 344 and 346 are provided on each side of the body 342, and a first one of the elements 344, 346 of each pair is in the alignment portion of the body 342 associated with the alignment length, $L_{Align}$. During use, the inner rail 330 is positioned by a worker with the outer or second end proximate to the receiving end 130 of the middle rail 120, and in this position, the magnets 344, 346 in the alignment length, $L_{Align}$, or alignment portion of body 342 apply a magnetic force that pulls the body 342 to the alignment zone/portion 610 of the sidewalls/rail elements 124, 126 of receiving end 130 of middle rail 120. This magnetic or attractive force assists the worker supporting a server chassis to properly position the guide assembly 340 near and against the end 130 of middle rail 120, with the outer magnets 344, 346 in the alignment zone or length of guide assembly 340 typically contacting the sidewalls or rail elements 124, 126 in alignment zone 610 (e.g., with a snapping action associated with use of magnets that provides an audible signal to the worker that alignment has been achieved).

FIG. 7 illustrates the rails 120, 330 with the end of inner rail 330 initially engaged with the receiving end 130 of middle rail 120. The guide assembly 340 may be thought of as having an initial engagement portion with a length, $L_{Engage}$, and a second or inner one of each pair of inner magnets 344, 346 may be thought of as facilitating initial engagement after alignment as shown in FIG. 7. The inner or second magnets 344, 346 (or inner portion when a single bar or longer magnet is used in place of two or more upper and lower magnets) are typically positioned on the body 342 adjacent to or overlapping with the sidewalls or rail elements 334, 346 of the inner rail 330. In this manner, the first or outer magnets of the lower and upper alignment pairs 344, 346 may be used for initial alignment while the second or inner magnets of the lower and upper alignment pairs 344, 346 may be used to maintain alignment during initial engagement. This has been found useful as merely providing initial alignment can often still result in improper engagement between the inner and middle rails 330, 120 as it minimizes risk for the inner rail rotating up or down before engagement is achieved as shown in FIG. 7. Hence, as shown in FIG. 6, the body 342 of the guide assembly 340 not only extends outward from the end of the inner rail 330 but also overlaps an engagement length or distance, $L_{Engage}$, and a magnet or portion of a magnet is provided in this portion so as to provide the magnetic alignment/engagement force between the inner rail 330 and the middle rail 120 during installation of a server in a storage rack.

FIG. 7 shows the "inner" side of the guide assembly 340 or the side of the body 342 that is opposite the middle rail 120 during alignment and engagement. In some cases, the magnets 344, 346 would be hidden from view as they may not extend through the body 340. As shown in FIG. 8, the inner rail 330 is shown from its "outer" side or the side that abuts or engages with the middle rail 120. As shown, the magnetic alignment elements 344, 346 are exposed on this outer surface of the body 342. The alignment elements 344, 346 may extend outward from the surface of the body 342 as shown or they may be flush or recessed from the body surface (or even be contained within the body 342). Each pair of alignment elements 344, 346 may be thought of as defining first and second (or lower and upper) alignment axes, Axis 1 and Axis 2 that are typically parallel (or substantially so) and are spaced apart a distance or spacing, $d_{magnets}$. The distance, $d_{magnets}$, between the alignment axes, Axis 1 and 2, is selected in one embodiment based on the longitudinal axes of the middle rail sidewalls or rail elements 124, 126 such that the magnetic fields provided by the magnetic alignment elements 344, 346 are applied to the rail elements 124, 126. This may be achieved by having the distance between the rail elements 124, 126 (or their longitudinal axes) matching or being similar to the distance, $d_{magnets}$, between alignment axes, Axis 1 and Axis 2. In the embodiment shown in FIG. 8, the tabs or extensions of the body 340 that support the magnetic alignment elements 344, 346 extend outward from the rail elements 334, 346, which allows the distance, $d_{magnets}$, to be greater than the width of the inner rail 330.

The above embodiments show the use of two magnetic alignment elements, such as permanent button magnets, for each magnetic alignment member or on each side of the guide assembly. Other embodiments may be used to provide a magnetic field on either side of the guide assembly (e.g., within an alignment region or zone and within an initial engagement zone of the body of the guide assembly). For example, three or more magnets of a variety of shapes may be provided on either side of the body to define two spaced apart alignment axes associated with rail element positions of a middle rail. In other cases, a single magnet may be used on either side of the body with each of these two magnets having a body that extends at least partially outward from the end of the inner rail so as to provide a magnetic field for initial alignment and a magnetic field for continuing alignment and initial engagement. The particular amount of overlap to obtain alignment that is desired may vary widely to practice the invention, but, in some embodiments, it is useful to achieve horizontal alignment by providing overlap or mating between the magnetic alignment elements and the rail component in the range of 0.0 to 0.5 inches and vertical alignment by providing overlap or mating in the range of 0.0 to 0.3 inches. In other cases, differing tolerances may be useful to achieve proper magnetic alignment/guidance.

Figure 9:
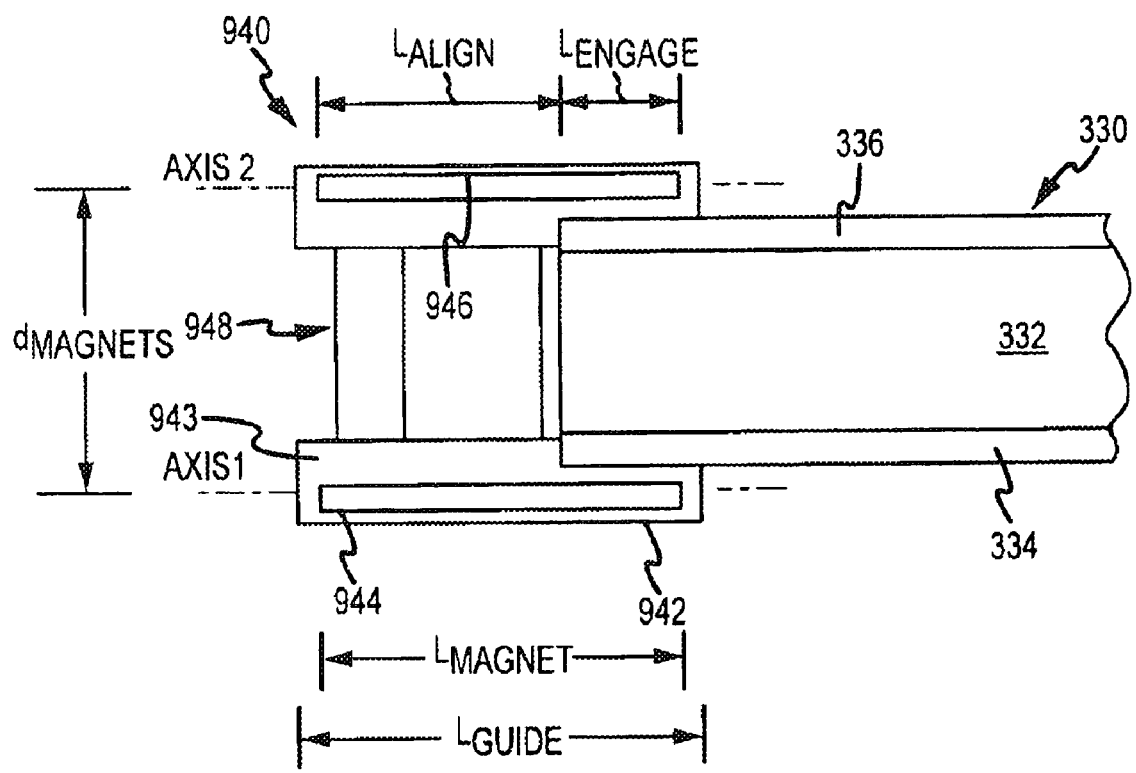
FIG. 9 illustrates a view similar to that of FIG. 8 showing an end of another embodiment of a magnetic guide assembly on an end of an inner rail showing use of elongate or bar magnets in place of two or more alignment magnets on either side of the inner rail.

FIG. 9 illustrates one arrangement for a magnetic guide assembly 940 that may be used on the end of an inner rail 330 to align the inner rail with a middle rail using a single magnet on each side of the guide body. As shown, the guide assembly 940 includes a body 942 with two side tabs or extensions 943 that are interconnected with a CMA retainer portion 948 (such as one or more loops for connecting to a CMA clasp or connector). The body 942 includes a first and a second magnetic alignment element 944, 946 (e.g., a lower and an upper alignment element) that are spaced apart a distance, $d_{magnets}$, which typically coincides with or is based upon a distance between rail elements of a middle rail. In the embodiment 940, each of the alignment elements 944, 946 may include a permanent bar magnet that may be elongated (e.g., a length greater than its width) with a length, $L_{magnet}$, that allows it to extend outward from the end of the inner rail 330 to define an alignment zone or portion of body with length, $L_{Align}$, and to overlap with the rail elements 334, 336 to define an engagement zone or portion of body 942 with length, $L_{Engage}$.

The above described invention including the preferred embodiment and the best mode of the invention known to the inventor at the time of filing is given by illustrative examples only. It will be readily appreciated that many deviations may be made from the specific embodiments disclosed in the specification without departing from the spirit and scope of the invention. For example, the size and strength of each magnet may be varied significantly to practice the magnetic guide assemblies described herein. In some cases, the magnets are permanent magnets with adequate strength to create enough force to provide at least some tactile feedback to service personnel installing a server and also to attach/couple the guide assemblies to the rail elements of the middle rails sometimes with an audible noise or snap to provide audible alignment feedback to the service personnel. Note, prototypes have indicated that the magnetic forces typically can be adequately strong to provide the above two forces without interfering substantially with sliding the server once engaged/supported by the middle rail, e.g., the sliding forces are orthogonal to the magnetic fields which allows the magnetic forces to be overcome to slide the server within the storage rack.

The magnetic alignment elements may take a variety of forms to practice the assemblies taught herein. In some cases, the magnets are permanent magnets such as neodymium magnets or the like with one embodiment using N52 neodymium magnets in button or disk form to provide the desired strength (e.g., 14.5 to 14.8 KGs of residual flux density, coercive force greater than about 11.2 KOe, and maximum energy production of about 49.5 to 52 MGOe). However, in other embodiments, other magnetic materials may be used to achieve these or other magnetic strength/fields characteristics useful for providing magnetic guide assemblies described herein. Further, other neodymium magnets may be used such as N46, N48, N50, and so on. Also, the embodiments shown typically call for the magnetic guide elements to be provided on the inner rail that is attached to the chassis or housing of the object being positioned on a storage or support rack, but, in some embodiments, the magnetic alignment elements are provided on the middle rails.

We claim:

1. A magnetic guide assembly aligning and engaging at least one inner rail, attached to a chassis, to at least one chassis to a middle rail of a storage rack, the magnetic guide assembly comprising:
    a body;
    a first magnetic alignment element comprising at least one permanent magnet; and
    a second magnetic alignment element comprising at least one permanent magnet, wherein the second magnetic alignment element is spaced apart a magnet separation distance from the first magnetic alignment element and wherein the first and second magnetic alignment elements extend an alignment length outward from an end of the inner rail when the body is mounted to the inner rail,
    wherein the middle rail has a first width and the inner rail has a second width less than the first width and wherein the body comprises first and second side tabs upon which the first and second magnetic alignment elements are mounted, respectively, the first and second tabs extending laterally outward from the body to define a body width that is substantially equal to the first width.

2. The assembly of claim 1, wherein the middle rail comprises a pair of ferrous rail elements with parallel, central longitudinal axes and wherein the magnet separation distance is about a distance between the longitudinal axes of the of the rail elements.

3. The assembly of claim 1, wherein the first and second magnetic alignment elements extend an engagement length inward from the end of the inner rail when the body is mounted to the inner rail.

4. The assembly of claim 3, wherein the first and second magnetic alignment elements each comprise first and second magnets and wherein the first magnet is positioned on the body in a portion corresponding to the alignment length and the second magnet is positioned on the body in a portion corresponding to the engagement length.

5. The assembly of claim 3, wherein the first and second magnetic alignment elements each comprise a bar magnet extending on the body in a region corresponding to both the alignment length and the engagement length.

6. The assembly of claim 1, wherein the body further comprises a cable management arm retainer positioned between the first and second magnetic alignment elements.

7. The assembly of claim 1, wherein the storage rack is adapted for supporting a chassis of a computing device such that the computing device is slidably positioned between a first, retracted position and a second, extended position, the storage rack comprising:
    a number of vertical supports;
    first and second spaced apart outer rails attached to the vertical supports;

the middle rail further defined by first and second middle rails supported by the first and second outer rails such that the middle rails may slide upon the outer rails;

the inner rail further defined by first and second inner rails configured for slidably engaging with the first and second outer rails, the first and second inner rails adapted for attachment to the chassis of the computing device; and the magnetic guide assembly further defined by first and second magnetic guide assemblies each attached to an exposed end of one of the first and second inner rails, wherein each of the magnetic guide assemblies comprises the first and second magnetic alignment elements extending outward an alignment distance from the exposed end of the corresponding one of the inner rails.

8. The assembly of claim 7, wherein each of the first and second middle rails comprises a body and an upper and a lower rail element extending outward from the body, the upper and lower rail elements comprise a ferrous material, whereby the first and second magnetic alignment elements apply attractive magnetic forces pulling the magnetic guide assemblies toward the middle rails.

9. The assembly of claim 8, wherein the first magnetic alignment element defines a first alignment axis and the second magnetic alignment element defines a second alignment axis and wherein the first and second alignment axes are separated by the magnet separation distance corresponding with a spacing of the upper and lower rail elements of the middle rails.

10. The assembly of claim 7, wherein each of the magnetic guide assemblies is attached to one of the first and second inner rails such that a portion of each of the first and second magnetic alignment elements extends an engagement distance adjacent to the exposed end, whereby magnetic forces are applied by the portions for the first and second magnetic alignment elements during initial engagement between the exposed ends of the inner rails and exposed ends of the middle rails.

11. The assembly of claim 10, wherein the alignment distance is at least about 0.5 inches and the engagement distance is at least about 0.25 inches.

12. The assembly of claim 7, wherein the body further comprises a central portion comprising a cable management arm retainer for mating with a connector of a cable management arm, and wherein the first and second side tabs extend laterally outward from the cable management arm retainer upon which the first and second magnetic alignment elements are attached.

13. The assembly of claim 1, wherein the first magnetic alignment element defines a first alignment axis and comprises first and second permanent magnets that are attached to the body along the first alignment axis, and wherein the second alignment element defines a second alignment axis and comprises third and fourth permanent magnets that are attached to the body along the second alignment axis.

* * * * *